United States Patent
Choi et al.

(10) Patent No.: US 7,172,938 B2
(45) Date of Patent: Feb. 6, 2007

(54) METHOD OF MANUFACTURING A SEMICONDUCTOR MEMORY DEVICE

(75) Inventors: Yong-suk Choi, Seoul (KR); Seung-beom Yoon, Gyeonggi-do (KR); Seong-gyun Kim, Gyeonngi-do (KR); Jae-Hwang Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 64 days.

(21) Appl. No.: 10/987,340

(22) Filed: Nov. 12, 2004

(65) Prior Publication Data

US 2005/0106816 A1    May 19, 2005

(30) Foreign Application Priority Data

Nov. 13, 2003    (KR)    .................... 10-2003-0080078

(51) Int. Cl.
*H01L 21/336*    (2006.01)
(52) U.S. Cl. ...................... 438/257; 438/288
(58) Field of Classification Search ............... 438/257, 438/288
See application file for complete search history.

(56) References Cited

U.S. PATENT DOCUMENTS

| 5,408,115 | A  |   | 4/1995  | Chang              |         |
|-----------|----|---|---------|--------------------|---------|
| 5,408,155 | A  |   | 4/1995  | Dickinson et al.   |         |
| 5,969,383 | A  | * | 10/1999 | Chang et al.       | 257/316 |
| 6,228,718 | B1 | * | 5/2001  | Huang et al.       | 438/266 |
| 6,388,293 | B1 | * | 5/2002  | Ogura et al.       | 257/365 |
| 6,399,441 | B1 | * | 6/2002  | Ogura et al.       | 438/257 |
| 6,639,271 | B1 | * | 10/2003 | Zheng et al.       | 257/324 |
| 6,674,138 | B1 | * | 1/2004  | Halliyal et al.    | 257/411 |
| 6,703,298 | B2 | * | 3/2004  | Roizin et al.      | 438/593 |
| 6,740,605 | B1 | * | 5/2004  | Shiraiwa et al.    | 438/795 |
| 6,794,711 | B2 | * | 9/2004  | Kang et al.        | 257/315 |
| 6,884,679 | B2 | * | 4/2005  | Park et al.        | 438/257 |
| 6,927,131 | B2 | * | 8/2005  | Kim                | 438/261 |
| 6,955,965 | B1 | * | 10/2005 | Halliyal et al.    | 438/257 |
| 6,960,527 | B2 | * | 11/2005 | Kang               | 438/694 |

\* cited by examiner

*Primary Examiner*—Andy Huynh
*Assistant Examiner*—David Goodwin
(74) *Attorney, Agent, or Firm*—Marger Johnson & McCollom, P.C.

(57) ABSTRACT

A tunneling dielectric layer, a charge trapping layer, a first length defining layer, and a second length defining layer are sequentially deposited on a semiconductor substrate. These layers are sequentially patterned. Exposed both sidewalls of the first length defining layer first pattern are recessed by selective side etching. After forming a blocking layer for covering the exposed charge trapping layer and a gate layer for filling the recessed portion, the gate layer is patterned to form spacer shaped gates. Dopant regions for source and drain regions are formed on the semiconductor substrate adjacent the gates.

19 Claims, 6 Drawing Sheets

METHOD OF MANUFACTURING A SEMICONDUCTOR MEMORY DEVICE

This application claims priority from Korean Patent Application No. 2003-80078 filed on Nov. 13, 2003 in the Korean Intellectual Property Office, the disclosure of which is incorporated herein in its entirety by reference.

BACKGROUND OF THE INVENTION

1. Field of the Invention

The present invention relates to a method of manufacturing a semiconductor memory device, and more particularly, to a method of manufacturing a non-volatile memory device such as a local silicon-oxide-nitride-oxide-silicon (SONOS) type semiconductor memory device.

2. Description of the Related Art

In recent years, non-volatile memory device such as SONOS devices have been developed. Unlike a gate stack type nonvolatile memory device that employs a floating gate, the SONOS device employs a charge trapping layer formed of silicon nitride instead of a floating gate in forming a memory cell.

Local SONOS devices are formed by defining a localized region of the charge trapping layer under a gate in which the gate and the charge trapping layer are partially overlapping only on a defined length.

A localized charge trapping layer was disclosed in U.S. Pat. No. 5,408,115 to Kno-Tung Chang, "Self Aligned, Split Gate EEPROM Device" registered on Apr. 18, 1995. In this method a control gate and a charge trapping layer are formed by a self alignment process.

Figure 1A:
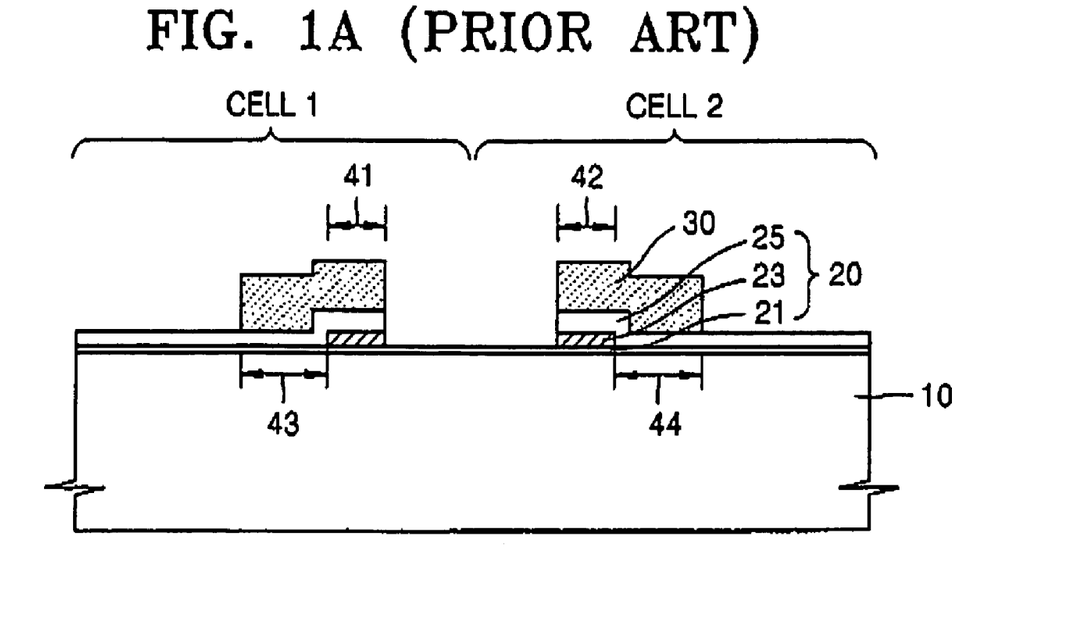
FIG. 1A is a cross-sectional view of a conventional local SONOS device.

FIG. 1A is a cross-sectional view of a cell configuration of a conventional local SONOS device.

Figure 1B:
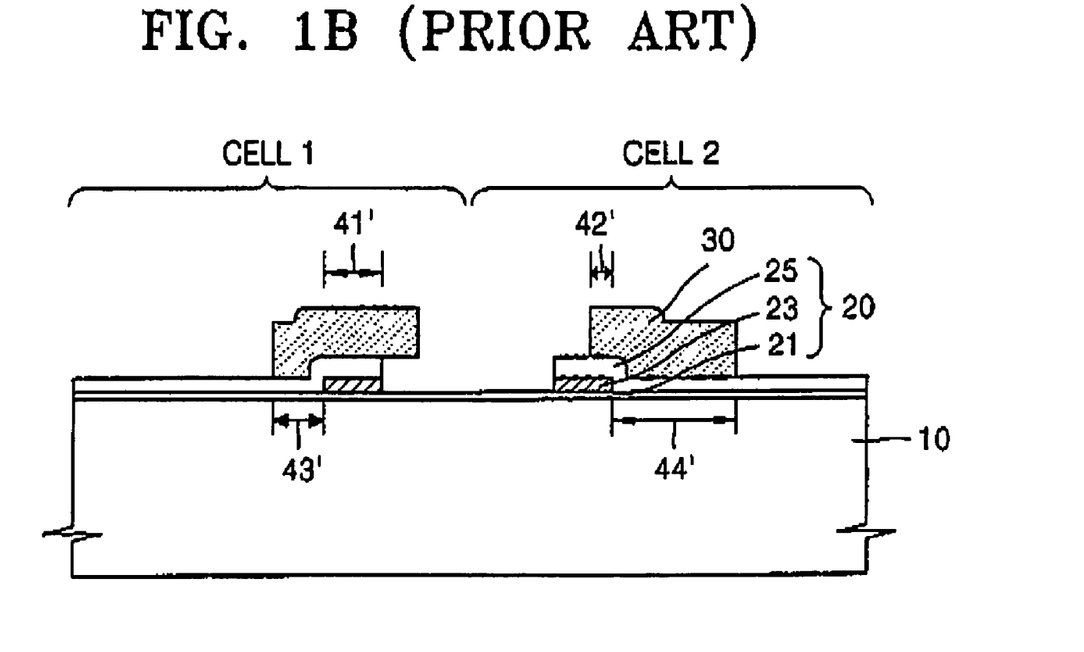
FIG. 1B is a cross-sectional view of a conventional local SONOS device for showing problems with the conventional local SONOS device.

FIG. 1B is a cross-sectional view showing problems with the conventional local SONOS device.

Referring to FIG. 1A, a conventional local SONOS device can comprise an ONO layer 20, i.e., a first silicon oxide layer 21, a locally defined silicon nitride layer 23, a second silicon oxide layer 25 on a silicon semiconductor substrate 10, and a gate 30 on top of the ONO layer 20.

However, when forming the conventional local SONOS device, lengths 41 and 42 along which the gate 30 is above the silicon nitride layer 23 and lengths 43 and 44 along which the silicon nitride layer 23 is not beneath the gate 30 in each cell may be different as result of a misalignment during a photo lithography process.

Referring to FIG. 1B, the lengths 41' and 42' on which the gates are above the silicon nitride layer 23 may not be the same if a photo misalignment occurs during a first photo lithography process for defining the local silicon nitride layer 23 and a second photo lithography process for patterning the gate 30.

Accordingly, the lengths 43' and 44' on which the silicon nitride layer 23 is not beneath the gates may also be different.

Such a photo misalignment can cause a difference in an effective length of the control gate 30 between the cells and a difference in an effective length of the local silicon nitride layer 23 for charge trapping. These differences between cell 1 and cell 2 results in an undesirable nonuniformity of operating characteristics between the cells.

SUMMARY OF THE INVENTION

According to one embodiment of the present invention, a method of manufacturing a semiconductor device comprises forming a tunneling dielectric layer on a semiconductor substrate; forming a charge trapping layer on the tunneling dielectric layer; sequentially forming a first length defining layer and a second length defining layer on the charge trapping layer; forming a second length defining layer pattern, a first length defining layer first pattern, a charge trapping layer pattern, and a tunneling dielectric layer pattern by partially removing the second length defining layer, the first length defining layer, the charge trapping layer, and the tunneling dielectric layer; forming a first length defining layer second pattern by selectively etching sidewalls of the first length defining layer first pattern, thereby forming recessed regions therein and exposing a region of the charge trapping layer pattern; forming a charge blocking layer on the semiconductor substrate and on the exposed region of the charge trapping layer pattern; forming a gate layer overlying the resulting structure and filling the recessed regions with the gate layer; forming spacer shaped gates by etching the gate layer; selectively etching the second length defining layer pattern and the first length defining layer pattern; and forming a first dopant region between the gates, and forming a second dopant region outside the gates.

DETAILED DESCRIPTION OF THE PREFERRED EMBODIMENTS

Figure 2:
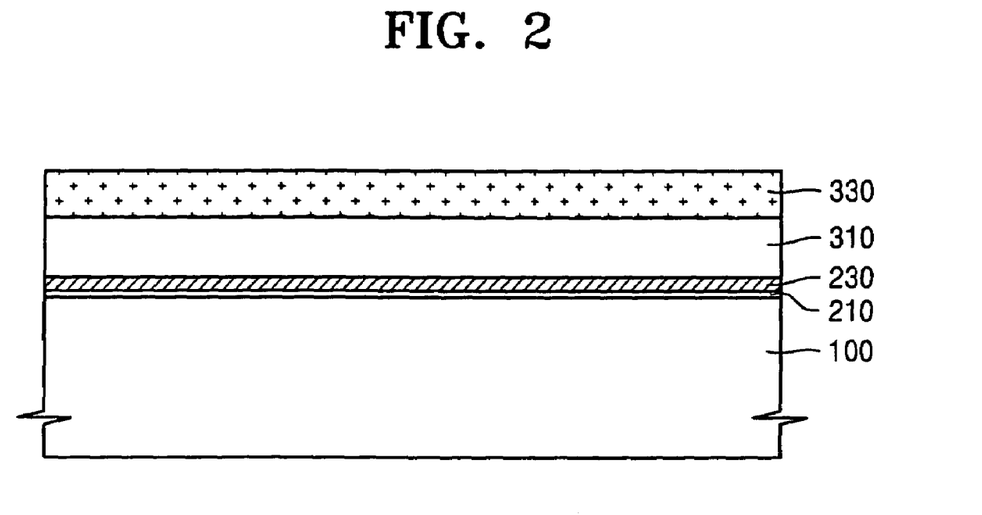
FIGS. 2 through 13 are cross-sectional views of a local SONOS device showing a method of manufacturing a semiconductor device according to embodiments of the present invention.

Referring to FIG. 2, a tunneling dielectric layer 210 is formed on the semiconductor substrate 100, and a charge trapping layer 230 is formed on the tunneling dielectric layer 210.

The tunneling dielectric layer 210 may be formed of an oxide through a thermal oxidation method or by chemical vapor deposition (CVD) method. The tunneling dielectric layer 210 may be formed of silicon oxide. The tunneling dielectric layer 210 is formed with a predetermined thickness to allow charge tunneling when the local SONOS device is in operation.

The charge trapping layer 230 may be formed of a material having a charge trap site, such as a silicon nitride ($Si_3N_4$) or an aluminum oxide ($Al_2O_3$). Preferably, the charge trapping layer is a silicon nitride layer.

The first length defining layer 310 is formed on the charge trapping layer 230. The first length defining layer 310 is employed for defining a length of the charge trapping layer 230 in the following process. A second length defining layer 330 that also defines a length of the charge trapping layer 230 with the first length defining layer 310, is formed on the first length defining layer 310.

Here, the first length defining layer 310 is formed of a material that has at least etching selectivity to the charge trapping layer 230. When the charge trapping layer 230 is preferably formed of silicon nitride, the first length defining layer 310 can be preferably formed of a silicon oxide having a wet etching selectivity or an isotropic dry etching selectivity to the silicon nitride. The thickness of the first length defining layer 310, which will be described later, is greater than that of the charge trapping layer 230, preferably approximately equal to that of the gate of the SONOS device because the thickness of the first length defining layer 310 relates to the thickness of the gate.

The second length defining layer 330 together with the first length defining layer 230 defines the length of the charge trapping layer 230 when the charge trapping layer 230 is patterned to be localized. Moreover, when the charge trapping layer 230 is localized, an overlapping length between the charge trapping layer 230 and the gate is defined by the second length defining layer 330 and the first length defining layer 310, thereby preventing the possibility of the misalignment described in reference to the conventional method.

Here, the second length defining layer 330 is formed of a material that has etching selectivity to the first length defining layer 310. When the first length defining layer 310 is preferably formed of silicon oxide formed by, i.e. by a CVD method, the second length defining layer 330 may be formed of a silicon nitride having a wet etching selectivity or an isotropic dry etching selectivity to the silicon oxide. Alternatively, the second length defining layer 330 may be formed of the same material as the charge trapping layer 230.

Figure 3:
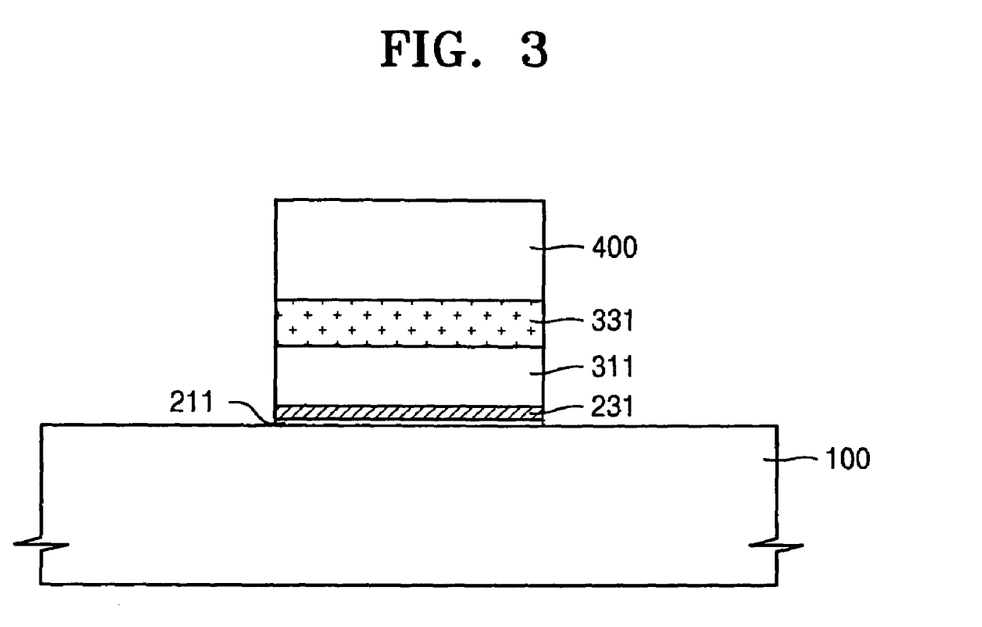

Referring to FIG. 3, an etch mask 400 for patterning is formed on the second length defining layer 330. A photoresist layer may be used as an etch mask 400.

A second length defining layer pattern 331, a first length defining layer first pattern 311, a charge trapping layer first pattern 231, and a tunneling dielectric layer first pattern 211 are sequentially patterned by selective etching using the etch mask 400. The selective etching can be performed by anisotropic dry etching.

Figure 4:
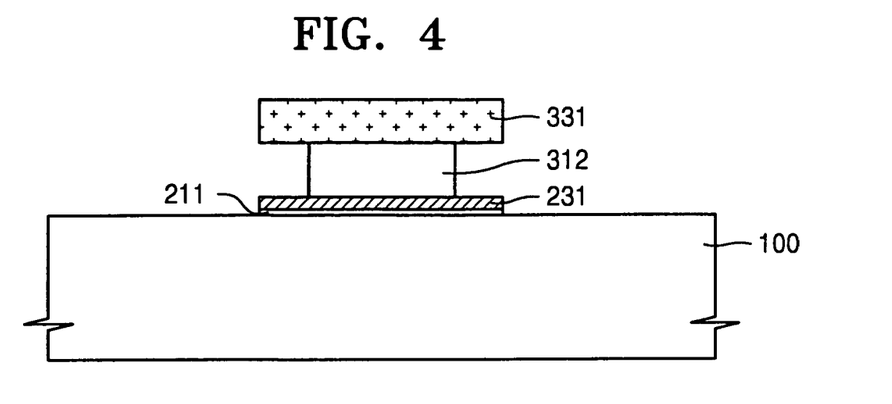

Referring to FIG. 4, sidewalls of the first length defining layer first pattern 311 are recessed a predetermined amount by etching the first length defining layer first pattern 311. The etching may be selectively performed because the first length defining layer first pattern 311 has an etch selectivity to the second length defining layer first pattern 331 and the charge trapping layer first pattern 231. The etching may be performed by wet etching or isotropic dry etching.

The amount of the first length defining layer first pattern 311 etched on both sides will be the same because both sidewalls are etched under the same etching conditions. Therefore, the recess widths from both sides of the first length defining layer first pattern 311 to both sides of the first length defining layer second pattern 312 are equal to each other. The size of the recess widths can be controlled by controlling etching time.

Consequently, the second length defining layer pattern 331 and the charge trapping layer first pattern 231 protrude relative to the first length defining layer second pattern 312. The protruding portion of the charge trapping layer first pattern 231 will be defined as a localized portion of the charge trapping layer first pattern 231 in the following process.

Figure 5:
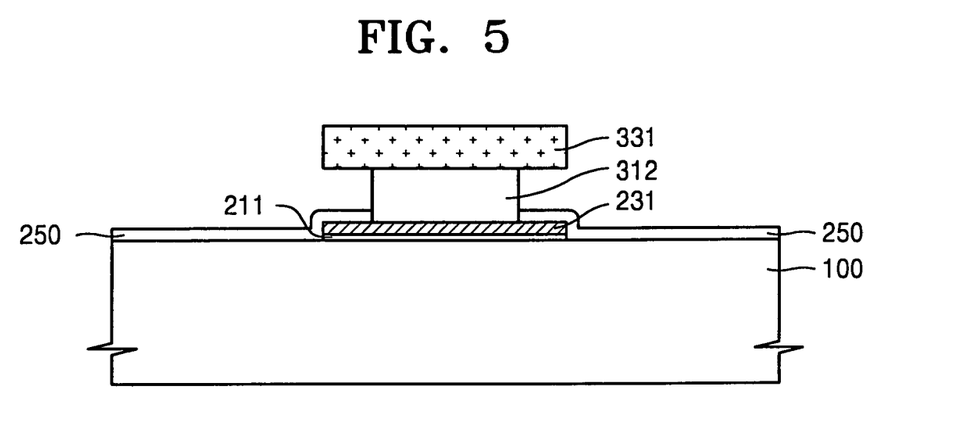

FIG. 5 is a cross-sectional view showing a process of forming a charge blocking layer 250 covering the exposed area of the charge trapping layer first pattern 231.

Referring to FIG. 5, the charge blocking layer 250 is formed with an insulating material covering the exposed area of the charge trapping layer first pattern 231 and the semiconductor substrate 100. The charge blocking layer 250 may be preferably formed of silicon oxide.

The charge blocking layer 250 may be formed by using a chemical vapor deposition (CVD) method on the exposed area of the charge trapping layer first pattern 231 and the entire surface of the semiconductor substrate 100. Accordingly, the charge blocking layer 250 may extend from the charge trapping layer first pattern 231 to the exposed adjacent surface of the semiconductor substrate 100.

Although not shown, the deposition of the charge blocking layer 250 may extend to the sidewalls of the first length defining layer second pattern 312 and the exposed surface of the second length defining layer pattern 331. However, the extended deposition (not shown) of the charge blocking layer 250 on the sidewalls of the first length defining layer second pattern 312 and on the exposed surface of the second length defining layer pattern 331 may be removed together in the following processes of removing the second length defining layer pattern 331 and the first length defining layer second pattern 312.

A thermal oxidation process may be further performed prior to performing the CVD process for forming the charge blocking layer 250, if necessary. That is, a thermal oxide layer may be formed on the exposed surface of the semiconductor substrate 100, on which the charge blocking layer 250 may be formed by using a CVD method. In this way, the quality of the charge blocking layer 250 is improved. It is desirable that the contacting portion of the charge blocking layer 250 to the semiconductor substrate 100 is formed of an improved quality of silicon oxide because the contacting portion will be a gate dielectric layer for interfacing between the gate and the semiconductor substrate 100 in a SONOS device. Also, the thermal oxidation process can cure damages that may have been caused on an exposed area of the tunneling dielectric layer pattern 211 during the etching of the sidewalls of the first length defining layer second pattern 312.

Figure 6:
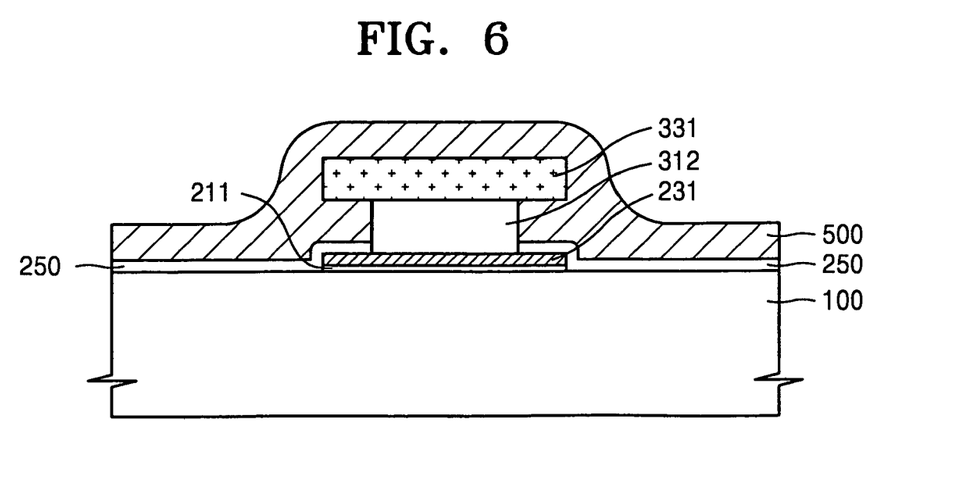

FIG. 6 is a cross-sectional view showing a process of forming a gate layer 500 covering the second length defining layer pattern 331 on the charge blocking layer 250.

Referring to FIG. 6, the gate layer 500 is formed on the charge blocking layer 250 by depositing a conductive material layer. At this time, the gate layer 500 is formed by filling the recessed regions between the second length defining layer pattern 331 and the charge trapping layer first pattern 231. That is, the gate layer 500 is extends toward both sidewalls of the first length defining layer second pattern 312 after filling the recessed regions.

The gate layer 500 can be formed by using a CVD method for completely filling the recessed regions from both sidewalls. A conductive poly crystalline silicon layer that is known as a material having a superior gap filling characteristic may be used as the gate layer 500. The gate layer 500 is formed also to cover the second length defining layer pattern 331 as depicted in FIG. 6 due to the deposition method.

The gate layer 500 also can be used to form a certain transistor gate that includes a logic circuit in an adjacent circuit region.

Figure 7:
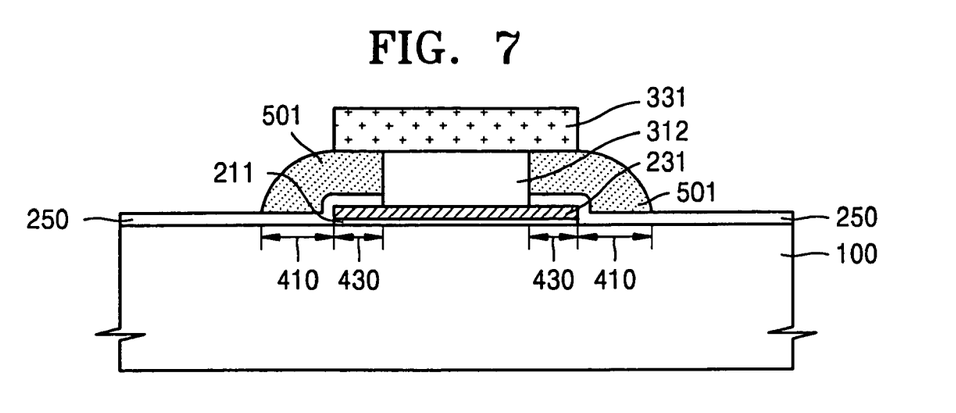

FIG. 7 is a cross-sectional view showing a process of patterning the gate 501 after performing a spacer etching.

Referring to FIG. 7, spacer etching is preformed on the gate layer 500. The spacer etching of the gate layer 500 is generally performed similarly to forming spacers. For example, the gate layer 500 is patterned to form a gate 501 shaped as by anisotropic dry etching until upper surfaces of the second length defining layer pattern 331 and the charge blocking layer 250 are exposed.

In this patterning process, both widths 410 of gate 501 are the same since the same spacer etching is used to form both gates 501. Therefore, the misalignment as depicted in FIG. 1B can be prevented.

Also, the overlapping widths 430 are equal to one another since the gate 501 is defined by the preceding spacer etching. The widths 430 become uniform in both cells by self aligning. Also, the widths 410 become uniform in both cells through self aligning. Therefore, the problem of the characteristic variation in each cell of a conventional SONOS device due to the misalignment in a photo process is solved.

In this patterning process, both widths 410 of the gate 501, particularly an area of the gate 501 overlapping with an area of the charge blocking layer 250, are substantially the same since the same spacer etching is used to form both gates 501. Therefore, the misalignment as depicted in FIG. 1B, e.g., the differences in the length 43' and 44' of the overlapping region between the gate 30 (in FIG. 1B) and the silicon oxide layer 25 (the charge blocking layer), can be prevented.

Therefore, the overlapping widths 430 are substantially equal to one another because the gate 501 is defined by the preceding spacer etching. As a result, the widths 430 become substantially uniform in both cells by a self-alignment process. Also, the widths 410 become substantially uniform in both cells through a self alignment process. Therefore, the problem of the characteristic variation in each cell of a conventional SONOS device due to the misalignment in a photolithography process can be solved.

Figure 8:
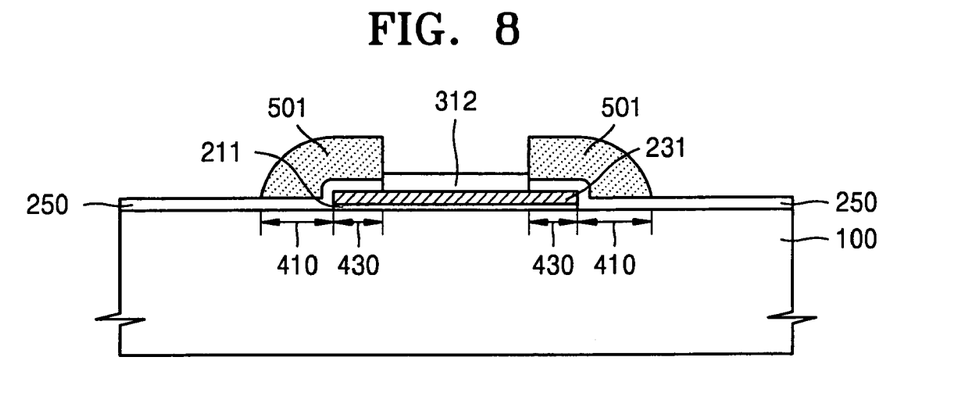

FIG. 8 is a cross-sectional view showing a process of removing the second length defining layer pattern 331.

Referring to FIG. 8, the second length defining layer pattern 331 is selectively removed. Since the second length defining layer pattern 331 is preferably formed of a silicon nitride, it has etching selectivity to the charge blocking layer 250 that is preferably formed of silicon oxide and the gate 501 that is preferably formed of polycrystalline silicon. Therefore, the second length defining layer pattern 331 can be selectively removed. For example, the second length defining layer pattern 331 can be removed by a silicon nitride strip method that uses phosphoric acid.

The thickness of the first length defining layer second pattern 312 can be reduced by selective etching. For this purpose, preferably the first length defining layer second pattern 312 is formed of a material having etch selectivity with respect to the gate 501 which is formed of a conductive material such as polycrystalline silicon and to the charge blocking layer 250. When both the first length defining layer second pattern 312 and the charge blocking layer 250 are formed of a silicon oxide, the silicon oxide used to form the first length defining layer second pattern 312 can be made to have etching selectivity to the silicon oxide used to form the charge blocking layer 250 by using silicon oxide having a lower density or higher porosity relative to the silicon oxide used to form the charge blocking layer 250.

An additional etch mask (not shown), such as a photoresist pattern, to prevent unwanted other portions from attacking or etching damage, may be employed in the process of etching the second length defining layer pattern 331 or the first length defining layer second pattern 312. In this case, the additional etch mask may be employed to block the charge blocking layer 250 partially covering the gate 501, and to expose at least the second length defining layer pattern 331 or first length defining layer second pattern 312. However, the employment of the additional etch mask may be omitted if the etching process provides enough etching control.

A SONOS device can be practically completed when dopant regions for source and drain regions on the substrate 100 are formed. The charge trapping layer first pattern 231 can be patterned once more before forming the dopant regions. However, a charge trapping layer required by the local SONOS device is already localized as depicted in FIG. 8 and the width 430 in both cells are substantially equal. Therefore, the patterning the charge trapping layer first pattern 231 may not be performed. Hereinafter, the two cases will be described.

Figure 9:
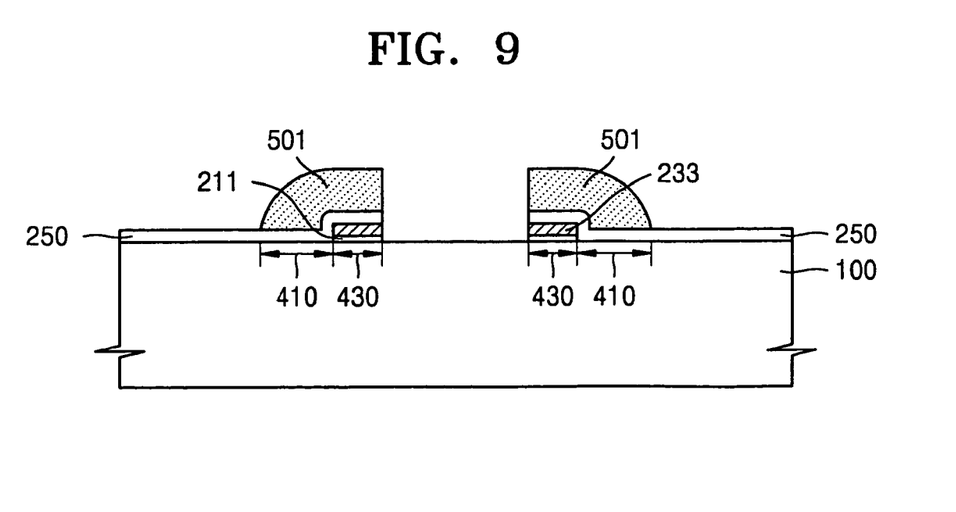

FIG. 9 is a cross-sectional view showing a process of patterning a charge trapping layer second pattern 233 by selective etching the charge trapping layer first pattern 231.

Referring to FIG. 9, the first length defining layer second pattern 312, the thickness of which was reduced in the earlier process, is removed by selective etching in the same way as described earlier referring to FIG. 8. Then, the charge trapping layer first pattern 231 exposed by removing the first length defining layer second pattern 312 is patterned to form the charge trapping layer second pattern 233 by selective etching and removing the exposed portion of the charge trapping layer first pattern 231. If the charge trapping layer first pattern 231 is formed of a silicon nitride, the exposed portion of the charge trapping layer first pattern 231 can be removed by performing a silicon nitride stripping process using phosphoric acid.

An additional etch mask may be employed during the process of patterning the charge trapping layer second pattern 233 as described earlier in reference to FIG. 8. Such an additional etch mask can be employed to expose a portion of gate 501 adjacent to the charge trapping layer first pattern 231 and a portion of the charge trapping layer first pattern 231 that will be exposed by removing the first length defining layer second pattern 312. The use of said additional etch mask enables reliable patterning of the charge trapping layer first pattern 231 without unwanted etching damage to other portions. However, the use of the additional etch mask may be omitted depending on the control of the etching process. The widths 430 in both cells are the same length since such patterning is eventually performed by self aligning to the pattern of the gate 501.

Figure 10:
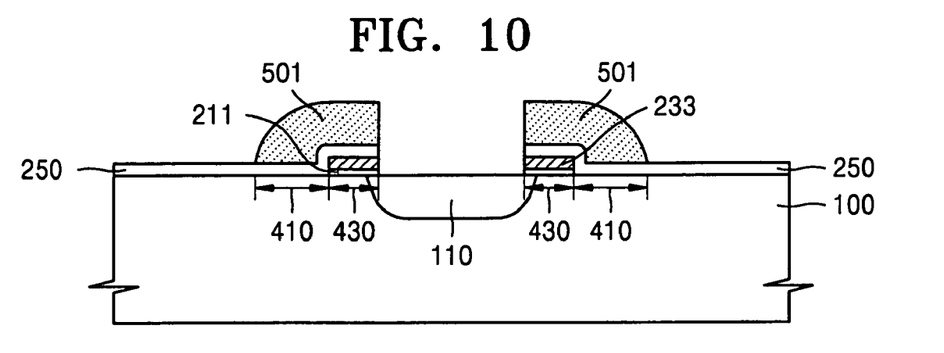

Referring to FIG. 10, the first dopant region 110 is formed by implanting a dopant selectively using an ion implantation method on the semiconductor substrate 100 between the charge trapping layer second pattern 233. The first dopant region 110 is used as a source region of a SONOS device. For the selective ion implantation of the dopant, a first ion implantation mask, i.e. a photo-resist pattern (not shown), may be employed. The first dopant region 110 is formed as a common source region.

Figure 11:
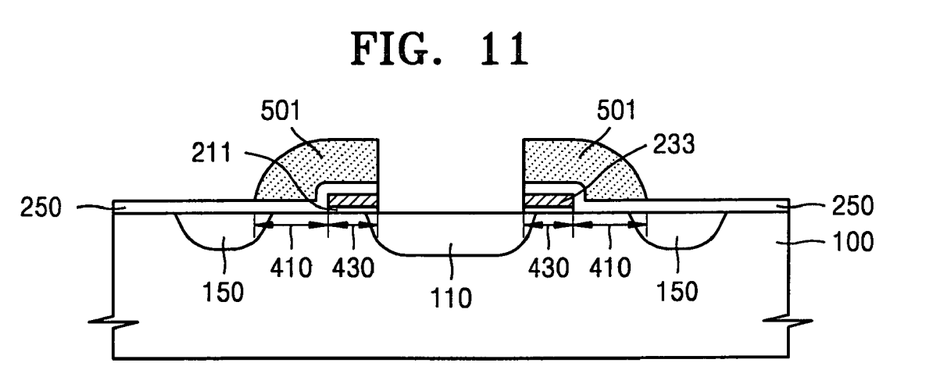

Referring to FIG. 11, the second dopant regions 150 are formed on the semiconductor substrate 100 along opposite sides of the gates 501. The second dopant regions 150 are formed outside the gates 501. The second dopant region 150 is formed by a selective ion implantation of dopants. For selective ion implantation of the dopants, a second ion implantation mask, i.e. a photo-resist pattern (not shown), may be employed. The second dopant region 150 is used as a drain region of a SONOS device.

Figure 12:
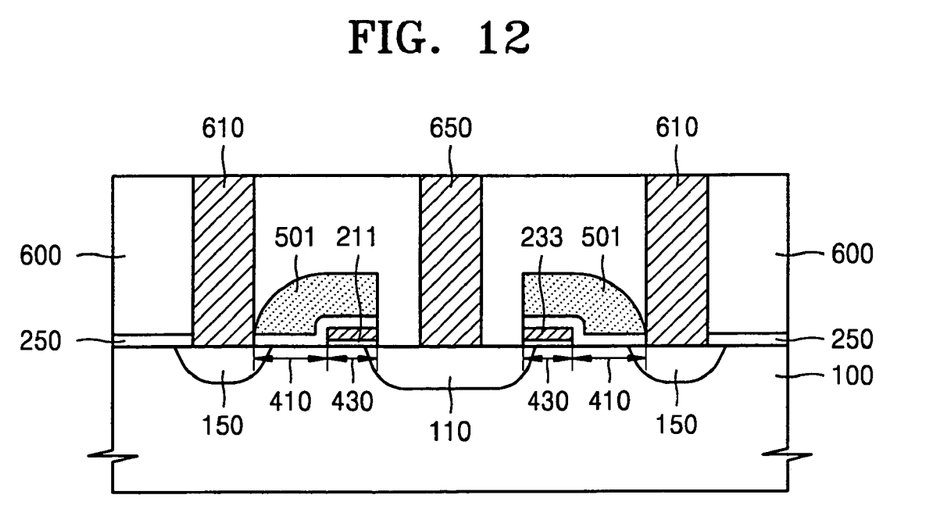

Referring to FIG. 12, after forming an insulating layer 600 covering the SONOS device, the bit line contacts 610 electrically connected to the drain region, i.e. the second dopant regions, are formed through the insulating layer 600. Also, the source contacts 650 electrically connected to the source region, i.e. the first dopant region 110, are formed through the insulating layer 600. Metal wiring is performed after forming these contacts 610 and 650.

According to the foregoing descriptions, the ion implantation of a dopant for forming the first or second dopant region may be performed after patterning the charge trapping layer first pattern 231 to the charge trapping layer second pattern 233. Alternatively, the ion implantation of dopants may be performed with the charge trapping layer first pattern 231 still remaining (without patterning the charge trapping layer first pattern 231). The charge trapping layer first pattern 231 on the substrate 100 between the two gates 501 will not affect the characteristics of the SONOS device because the widths 430 of the charge trapping layer for a local SONOS device were already defined in the earlier stage. Therefore, the ion implantation of the dopants may be performed with the charge trapping layer first pattern 231 as depicted in FIG. 8.

Figure 13:
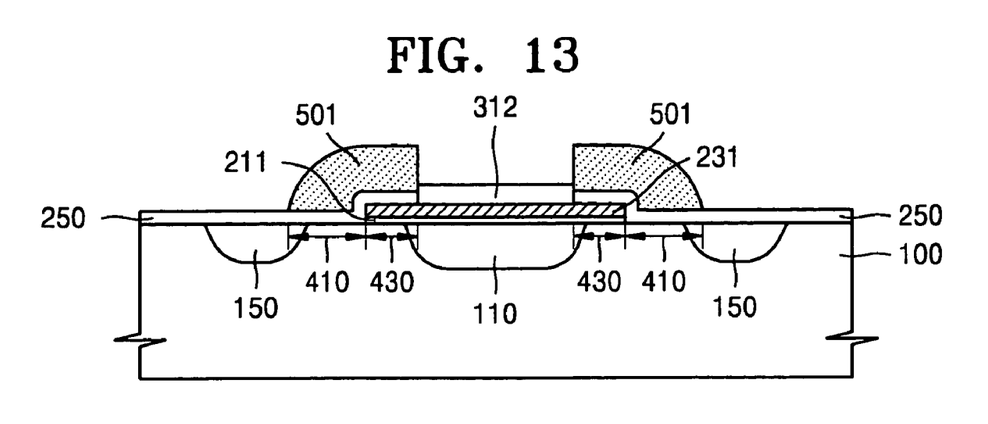

FIG. 13 is a cross-sectional view showing a process of forming the first dopant region 110 on the semiconductor substrate 100 using the charge trapping layer first pattern 231 as a buffer.

Referring to FIG. 13, as described referring to FIG. 8, the first dopant region 110 is formed by selective ion implantation of dopants on the semiconductor substrate 100 with a remaining portion of the first length defining layer second pattern 312 on the charge trapping layer first pattern 231. The first dopant region is used as a source region in a SONOS device.

The source region may be formed by higher voltage ion implantation than the drain region.

Portions of the first length defining layer second pattern 312, the charge trapping layer first pattern 231, or the tunneling dielectric layer pattern 211 between the two gates 501 may be used as a buffer layer for the ion implantation of dopants for the first dopant region. A first ion implantation mask, i.e. a photo-resist pattern (not shown), may be employed for selective ion implantation.

Second dopant regions 150 are formed on the semiconductor substrate 100 along opposite sides of the gate 501. The second dopant regions are formed outside the gates 501. The second dopant regions 150 are formed by selective ion implantation of dopant. For the selective ion implantation of the dopant, a first ion implantation mask, i.e. a photo-resist pattern (not shown), may be employed.

Afterward, metal wiring may be performed after forming bit line contacts 610 and a source contact 650 as described referring to FIG. 12.

According to one aspect of the present invention, widths of a charge trapping layer directly below the gates in both cells can be formed substantially the same length when forming a local SONOS device. Also, widths of the charge blocking layer directly below the gates are formed in substantially the same length in both cells. Accordingly, the characteristic uniformity of devices between the both cells can be improved.

Further, according to another aspect of the present invention, the overlapping width where the charge trapping layer is directly below the gate is very small, smaller than the limit in a conventional photo technique. This is a great advantage for reducing the cell size of a SONOS device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of manufacturing a semiconductor device, the method comprising:

forming a tunneling dielectric layer on a semiconductor substrate;

forming a charge trapping layer on the tunneling dielectric layer;

sequentially forming a first length defining layer and a second length defining layer on the charge trapping layer;

forming a second length defining layer pattern, a first length defining layer first pattern, a charge trapping layer pattern, and a tunneling dielectric layer pattern by partially removing the second length defining layer, the first length defining layer, the charge trapping layer, and the tunneling dielectric layer;

forming a first length defining layer second pattern by selectively etching sidewalls of the first length defining layer first pattern, thereby forming recessed regions therein and exposing a region of the charge trapping layer pattern;

forming a charge blocking layer on the semiconductor substrate and on the exposed region of the charge trapping layer pattern;

forming a gate layer overlying the resulting structure and filling the recessed regions with the gate layer;

forming spacer shaped gates by etching the gate layer;

selectively etching the second length defining layer pattern and the first length defining layer pattern; and forming a first dopant region between the gates, and forming a second dopant region outside the gates.

2. The method of claim 1, wherein selectively etching the sidewalls comprises isotropic etching with an etchant having an etching selectivity with respect to the second length defining layer pattern and the charge trapping layer pattern.

3. The method of claim 2, wherein the first length defining layer is formed of an insulating material having etching selectivity to the charge trapping layer pattern and the second length defining layer pattern.

4. The method of claim 3, wherein the first length defining layer is formed of silicon oxide.

5. The method of claim 4, wherein the charge trapping layer is formed of silicon nitride.

6. The method of claim 4, wherein the second length defining layer is formed of silicon nitride.

7. The method of claim 3, wherein the isotropic etching of the sidewalls is performed by a wet etch process or a dry etch process.

8. The method of claim 1, wherein the charge blocking layer is formed of an insulating material different from that of the charge trapping layer by chemical vapor deposition (CVD).

9. The method of claim 8, wherein the charge blocking layer is formed of silicon oxide.

10. The method of claim 8, wherein thermal oxidation is further performed before the CVD.

11. The method of claim 1, wherein the gate layer includes a conductive polycrystalline silicon layer.

12. A method of manufacturing a semiconductor device, the method comprising:

forming a tunneling dielectric layer on a semiconductor substrate;

forming a charge trapping layer on the tunneling dielectric layer;

forming a first length defining layer and a second length defining layer on the charge trapping layer;

forming a second length defining layer pattern, a first length defining layer first pattern, a charge trapping layer first pattern, and a tunneling dielectric layer pattern by partially removing the second length defining layer, the first length defining layer, the charge trapping layer, and the tunneling dielectric layer;

selectively etching sidewalls of the first length defining layer first pattern, thereby forming a first length defining layer second pattern, forming recessed regions therein and exposing a region of the charge trapping layer first pattern;

forming a charge blocking layer on the semiconductor substrate and on the exposed region of the charge trapping layer first pattern;

forming a gate layer overlying the resulting structure and filling the recessed regions with the gate layer;

forming spacer shaped gates by etching the gate layer;

forming a charge trapping layer second pattern by selectively etching the second length defining layer second pattern, the first length defining layer pattern, and a portion of the charge trapping layer first pattern between the gates; and forming a first dopant region between the gates, and forming a second dopant region outside the gates.

13. The method of claim 12, wherein selectively etching the sidewalls comprises isotropic etching with an etchant having an etching selectivity with respect to the second length defining layer pattern and the charge trapping layer pattern.

14. The method of claim 13, wherein the first length defining layer is formed of silicon oxide.

15. The method of claim 14, wherein the charge trapping layer is formed of silicon nitride.

16. The method of claim 14, wherein the second length defining layer is formed of silicon nitride.

17. The method of claim 12, wherein the charge blocking layer is formed by CVD.

18. The method of claim 17, wherein the thermal oxidation is further performed before the CVD.

19. The method of claim 12, wherein the gate layer includes a conductive polycrystalline silicon layer that fills the recessed regions.

* * * * *

UNITED STATES PATENT AND TRADEMARK OFFICE
CERTIFICATE OF CORRECTION

PATENT NO. : 7,172,938 B2 Page 1 of 1
APPLICATION NO. : 10/987340
DATED : February 6, 2007
INVENTOR(S) : Yong-suk Choi et al.

It is certified that error appears in the above-identified patent and that said Letters Patent is hereby corrected as shown below:

Column 1, line 29, the word "Kno-Tung" should read -- Kuo-Tung --.

Signed and Sealed this

Twenty-sixth Day of August, 2008

JON W. DUDAS
*Director of the United States Patent and Trademark Office*